(12) United States Patent
Haba et al.

(10) Patent No.: US 10,600,747 B2
(45) Date of Patent: Mar. 24, 2020

(54) VERTICAL CAPACITORS FOR MICROELECTRONICS

(71) Applicant: Invensas Corporation, San Jose, CA (US)

(72) Inventors: Belgacem Haba, Saratoga, CA (US); Javier A. Delacruz, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 16/217,622

(22) Filed: Dec. 12, 2018

(65) Prior Publication Data

US 2019/0214353 A1 Jul. 11, 2019

Related U.S. Application Data

(60) Provisional application No. 62/616,024, filed on Jan. 11, 2018.

(51) Int. Cl.

| H01L 23/522 | (2006.01) |
|---|---|
| H01L 23/66 | (2006.01) |
| H01L 23/498 | (2006.01) |
| H01L 25/16 | (2006.01) |
| H01L 21/48 | (2006.01) |
| H01L 49/02 | (2006.01) |
| H01L 23/00 | (2006.01) |

(52) U.S. Cl.
CPC ............ *H01L 23/66* (2013.01); *H01L 21/486* (2013.01); *H01L 23/49816* (2013.01); *H01L 23/49827* (2013.01); *H01L 23/49838* (2013.01); *H01L 24/16* (2013.01); *H01L 25/16* (2013.01); *H01L 28/60* (2013.01); *H01L 24/13* (2013.01); *H01L 2223/6666* (2013.01); *H01L 2224/13101* (2013.01); *H01L 2224/16265* (2013.01); *H01L 2924/15311* (2013.01); *H01L 2924/19041* (2013.01); *H01L 2924/19102* (2013.01)

(58) Field of Classification Search
CPC .. H01L 23/5222; H01L 23/5223; H01G 4/232
See application file for complete search history.

(56) References Cited

U.S. PATENT DOCUMENTS

2017/0178819 A1\* 6/2017 Wang .................... H01G 4/385

\* cited by examiner

*Primary Examiner* — Jae Lee

(57) ABSTRACT

Vertical capacitors for microelectronics are provided. An example thin capacitor layer can provide one or numerous capacitors to a semiconductor chip or integrated circuit. In an implementation, a thin capacitor layer of 50-100 μm thickness may have 5000 vertically disposed capacitor plates per linear centimeter, while occupying only a thin slice of the package. Electrodes for each capacitor plate are accessible at multiple surfaces. Electrode density for very fine pitch interconnects can be in the range of 2-200 μm separation between electrodes. A redistribution layer (RDL) may be fabricated on one or both sides of the thin capacitor layer to provide fan-out ball grid arrays that occupy insignificant space. RDLs or through-vias can connect together sets of the interior vertical capacitor plates within a given thin capacitor layer to form various capacitors from the plates to meet the needs of particular chips, dies, integrated circuits, and packages.

26 Claims, 10 Drawing Sheets

VERTICAL CAPACITORS FOR MICROELECTRONICS

RELATED APPLICATIONS

This patent application claims the benefit of priority to U.S. Provisional Patent Application No. 62/616,024 to Haba et al., filed Jan. 11, 2018 and incorporated by reference herein, in its entirety.

BACKGROUND

Semiconductor chips and dies conventionally have capacitors connected in physical proximity, to decouple noise and filter signals, for example. Discrete capacitors can be difficult to integrate into small microelectronic packages, and their physical sizes and shapes make them awkward within assembly processes.

Capacitors manufactured within the design of a microelectronic assembly may offer only limited capacitance, and are still relatively difficult to integrate into some manufacturing processes.

SUMMARY

Vertical capacitors for microelectronics are provided. An example thin capacitor component can provide one or numerous capacitors to a semiconductor chip, die, or integrated circuit. In an implementation, a thin capacitor component of approximately 50-400 μm thickness may have 5000 vertically disposed capacitor plates per linear centimeter of the thin capacitor layer. Electrodes for each capacitor plate can be accessible at a top and a bottom surface of the thin capacitor component. Electrode density for very fine pitch interconnects can be in the range of 2-200 μm separation between electrodes. A redistribution layer (RDL) may be fabricated on one or both sides of the thin capacitor component, and ball grid arrays, such as wafer level ball grid arrays (WLBs) may be built on the electrodes or to the RDLs on one or both sides of the thin capacitor layer. Each or multiple RDLs can connect sets of the interior vertical capacitor plates together within a given thin capacitor component to form various capacitors from the plates to meet the needs of particular chips, dies, and integrated circuits. The thin capacitor component may connect to chips or integrated circuits via a first ball grid array on one side, and have a second ball grid array on its other side, for further connection, thereby adding only approximately 50-400 μm of thickness to chip, die, or package, while providing most or all of the capacitor needs of the package.

This summary is not intended to identify key or essential features of the claimed subject matter, nor is it intended to be used as an aid in limiting the scope of the claimed subject matter.

DETAILED DESCRIPTION

Overview

This disclosure describes example vertical capacitors for microelectronics. An example microelectronic apparatus provides relatively large and configurable capacitance in a very thin sheet or layer of a microelectronics package, which can be located as close as possible to a semiconductor die without obstructing the signal traces of an integrated circuit or other electronic package. The example vertical capacitors may be used as decoupling capacitors to suppress high-frequency noise present in power signals that could harm the die of an integrated circuit. When integrated as bypass capacitors, the example vertical capacitor units can also provide a local power buffer for an integrated circuit, supplying brief stand-in power during short voltage drops. The example construction design of the example vertical capacitors enables close proximity to the integrated circuit, thereby optimizing their ability to decouple unwanted noise signals.

The example vertical capacitors can also provide signal filtering. The particular design of an example vertical capacitor can provide a unique response to signals of varying frequencies. For example, the vertical capacitors can block DC components of signals and block low frequency components, while allowing higher frequencies to pass.

In an implementation, the example vertical capacitors can be constructed in a laminated package suitable for various packaging technologies, such as embedded wafer level ball grid array (eWLB), in which the package interconnects are applied onto a wafer of silicon and casting compound, for example.

In an implementation, an example vertical capacitor package may have available electrodes at a very fine pitch of only microns apart, spread over an entire top or an entire bottom of the capacitor unit. In an implementation, the example vertical capacitor package has available electrodes at a very fine pitch arrayed over both top and bottom surfaces of the example capacitor package, with the electrodes available to multiple layers or multiple levels of a 3D microelectronics package.

Example Components

Figure 1:
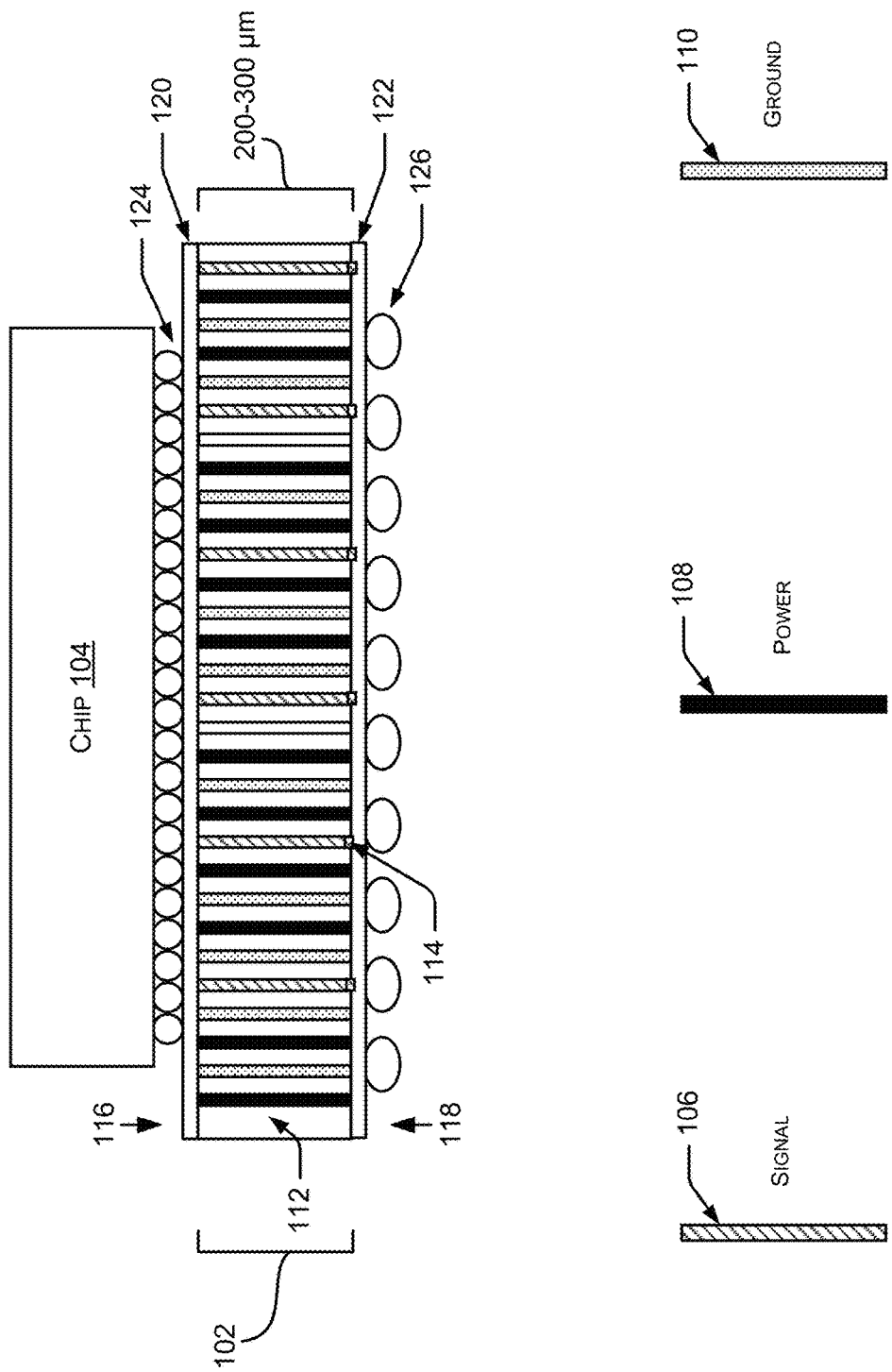
FIG. 1 is a diagram of an example thin capacitor layer with densely packed vertically disposed capacitive plates.

FIG. 1 shows an example apparatus 100 that includes a capacitor layer 102 or capacitor layers that underlie a semiconductor chip 104, die, or integrated circuit. The shown capacitor layer 102 may be referred to herein as a capacitor layer, a capacitor, or a capacitor component. In FIG. 1, there may be vertical capacitor plates for signal 106, power 108, and ground 110 in the capacitor layer 102 laminated into a stack (102), interleaved with vertical dielectric layers 112.

Electrodes 114 of the vertical capacitor plates 106 & 108 & 110 at both the top surface 116 and the bottom surface 118 of the capacitor layer 102 are accessible from the top surface 116 or bottom surface 118 of the capacitor layer 102. The capacitor layer 102 may be 50-400 micrometers (μm) thick, for example, between the top surface 116 and the bottom surface 118 of the capacitor layer 102. The various capacitor plates for signal 106, power 108, and ground 110 may be stacked in any suitable order with respect to each other, depending on application.

In an implementation, a wafer level fan-out layer may be attached to the electrodes 114 on the top surface 116 and/or the bottom surface 118 of the capacitor layer 102. One or more intervening redistribution layers (RDLs) 120 & 122 may be built on the electrodes 114 on the top surface 116 or the bottom surface 118 of the capacitor layer 102. In an implementation, a ball grid array (BGA) 124 can be built on a surface of the capacitor layer 102, for example on one or more RDLs 120 & 122.

Figure 2:
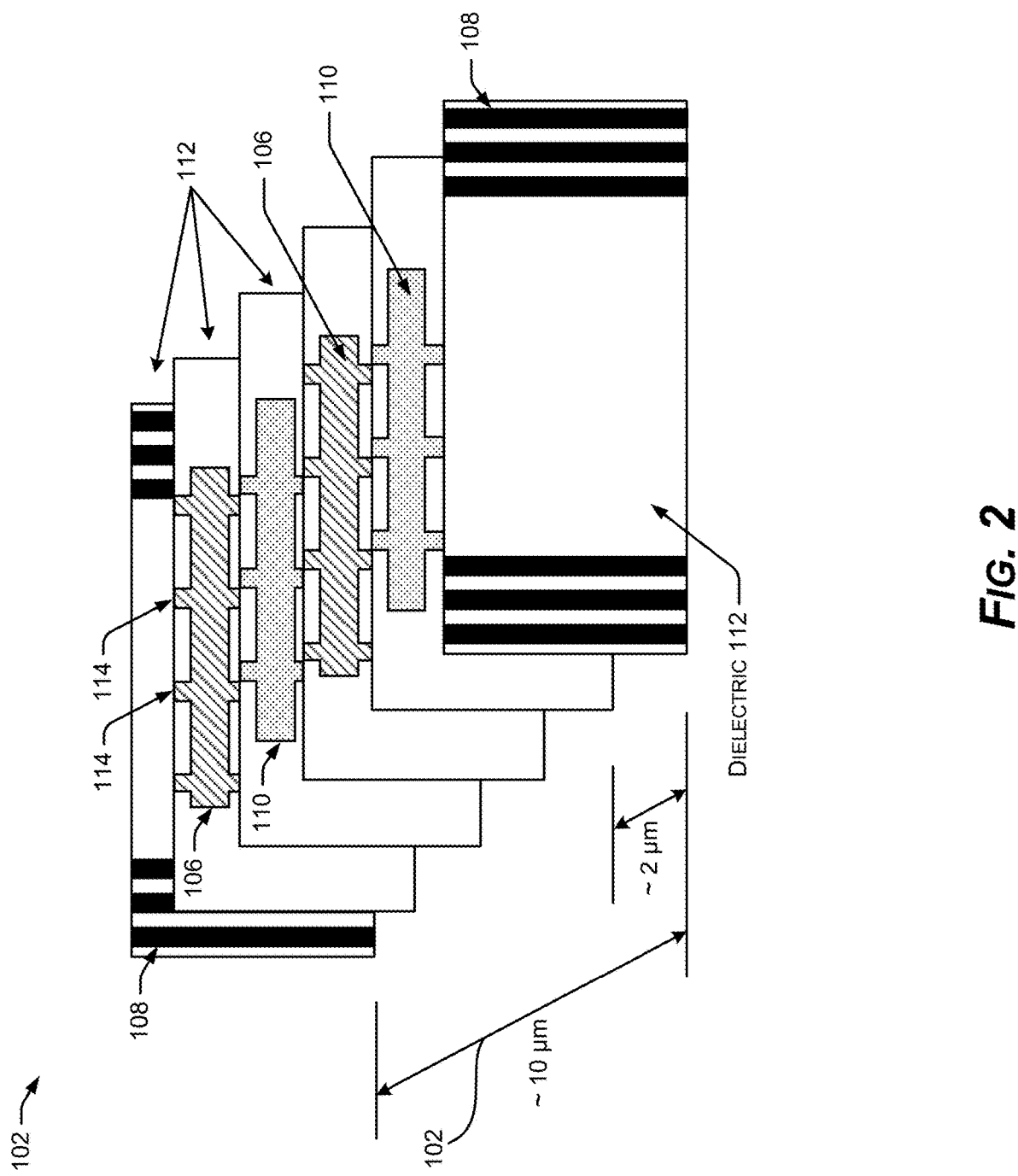
FIG. 2 is a diagram of an example stack assembly for making the example thin capacitor layer with densely packed vertically disposed capacitive plates.

As shown in FIG. 2, the vertical capacitor plates, laminated with interleaved vertical dielectric layers 112, can be approximately 2 μm apart from each other. These vertical capacitor plates may be power planes 108, ground planes 110, or signal planes 106 interleaved with each other and laminated with the interleaved vertical dielectric layers 112 or other insulators. The stack 102 can constitute one capacitor, or an entire set of capacitors for a microelectronics package, depending on how the plates 106 & 108 & 110 are arranged and electrically connected with each other at their top and bottom edges, or how they are connected with through-vias that connect from plate to plate or through a series of plates or alternate plates within the body of the capacitive layer 102.

In one implementation, the capacitor plates 106 & 108 & 110 are formed through a conventional deposition process on one side or on opposing sides of a low K dielectric substrate 112. The substrate itself 112 may separate adjacent capacitors or may function as part of a capacitor, i.e., as the capacitor dielectric 112 between a cathode and an anode. The substrates 112 may be glued or bonded in numerous known manners, such as through an adhesive, by direct-bonding, oxide-to-oxide direct bonding, or hybrid interconnect bonding techniques. Moreover, the substrates 112 may be bonded such that capacitor plates 108 & 110 are in a face-to-face configuration, a backside-to-backside configuration, or in the face-to-backside configuration shown in FIG. 2. In a face-to-face configuration a thin oxide, such as an oxide bonding layer, may serve as the thin dielectric between the capacitor plates 108 & 110, for example.

Figure 9:
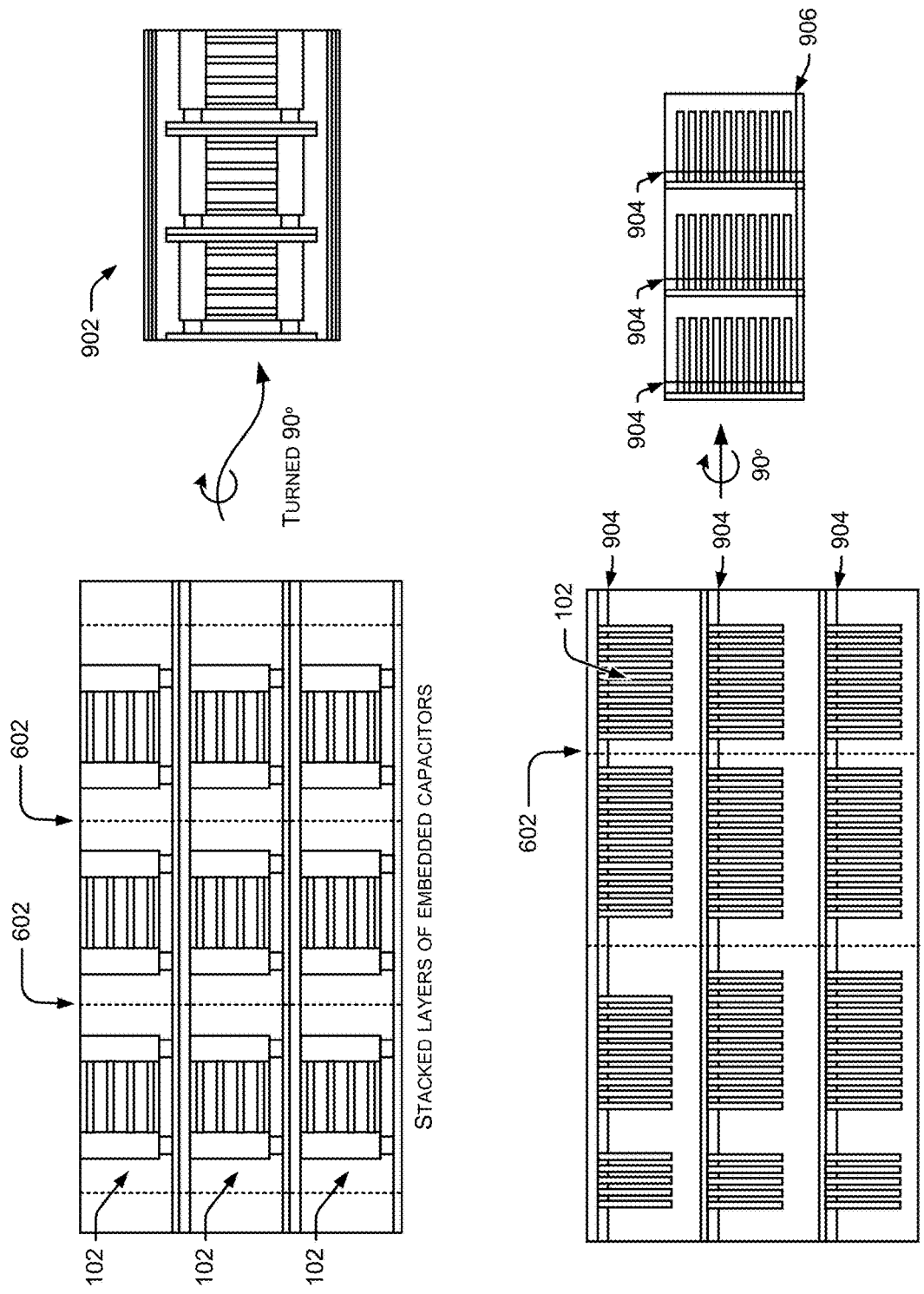
FIG. 9 is a diagram of example construction of ganged capacitor layers and capacitor layers combined with through-vias.

Pass-through lines not connected to a capacitance element, such as certain power 108, ground 110, and other unrelated signal lines 106, are shown on their own substrates in FIG. 2. It is noted that such pass-through conductive features can be placed on the same substrate 112 as the capacitor plates 108 & 110, in some circumstances. It is also noted that while the capacitor plates 108 & 110 shown in FIG. 2 each have multiple contacts 114 on each edge of the substrate 112, only a single contact 114 per side can be implemented, when needed, according to the particular circuit design or requirements. Also, while FIG. 2 does not show conductive through-vias extending between respective capacitor plates 106 or 110 (i.e., penetrating in the depth direction of the vertical stack 102, and penetrating from plate to plate within the interior body of the capacitive layer 102), such may be implemented without diverting from the present disclosure. Such through-vias are shown in FIG. 9, and allow 3D structures, such as inductors, resistors, R-C circuits, and so forth, that extend at least partially between the plates 112 to be included. In fact, each substrate 112 may have a plurality of passive devices or signal lines extending along or through it in order to create a desired circuit layout.

Figure 3:
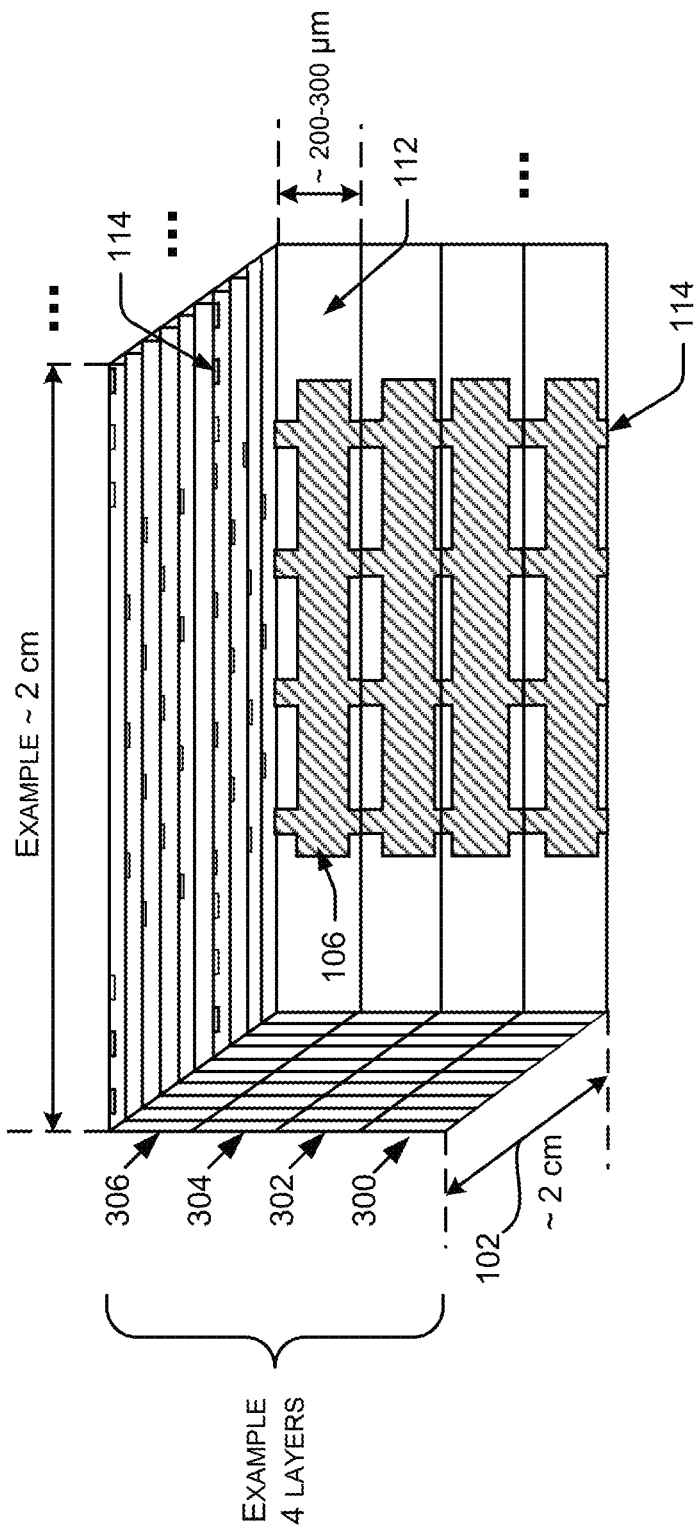
FIG. 3 is a diagram of an example technique for constructing a stack of layers, to be sliced into capacitive layers.

As shown in FIG. 3, the laminated stack 102 may have multiple copies of capacitor plates 106 on a given sheet or substrate 112, before the laminated stack 102 of sheets or substrates 112 is sliced or partitioned to yield multiple layers 300 & 302 & 304 & 306 that may be about 50-400 μm thick, apiece, for example. In example implementations, the laminated stack 102 may be sliced or partitioned into long strips, with an example width of 2 cm and example thickness of 200-300 μm, or cut into example squares of 2 cm×2 cm down to 0.8×0.8 cm, for example, at the example thickness of 50-400 μm.

Figure 4:
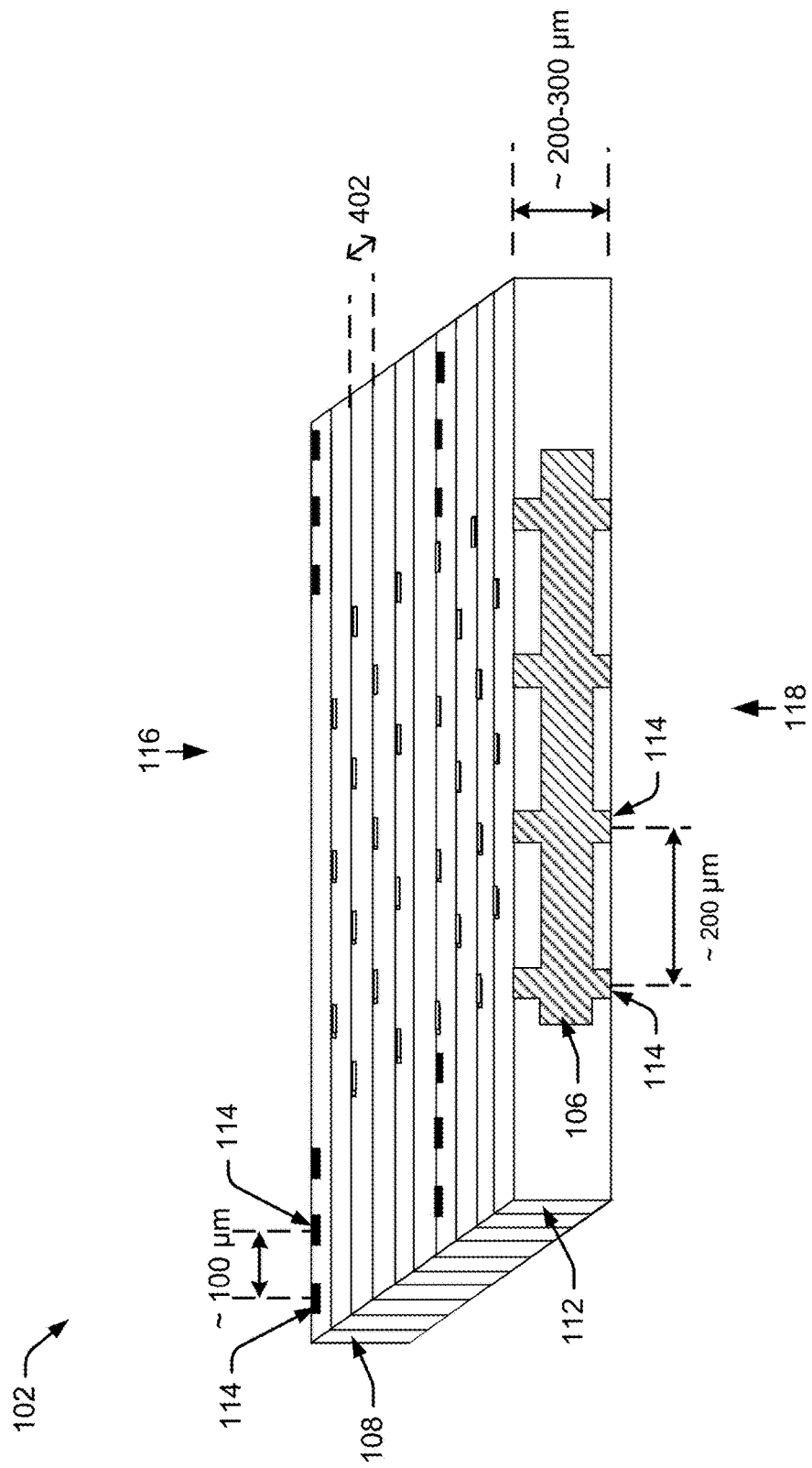
FIG. 4 is a diagram of example dimensions and electrode placement of an example thin capacitor layer.

FIG. 4 shows some example design parameter considerations. For example, in an implementation, adjacent electrodes 114 on a top 116 or a bottom 118 of each vertical capacitor plate 112 can be approximately 100 μm apart from each other on each single power plane 108 or single ground plane 110. The electrodes 114 on a top 116 or a bottom 118 of each vertical capacitor plate 106 can be spaced approximately 200 μm apart from each other on each single signal plane 106, for example.

The electrodes 114 on neighboring adjacent capacitor plates 106 (depth-wise 402) in the laminated stack 102 can be as little as approximately 0.1-3.0 μm apart from each other or even less, across an intervening dielectric layer 112.

Figure 5:
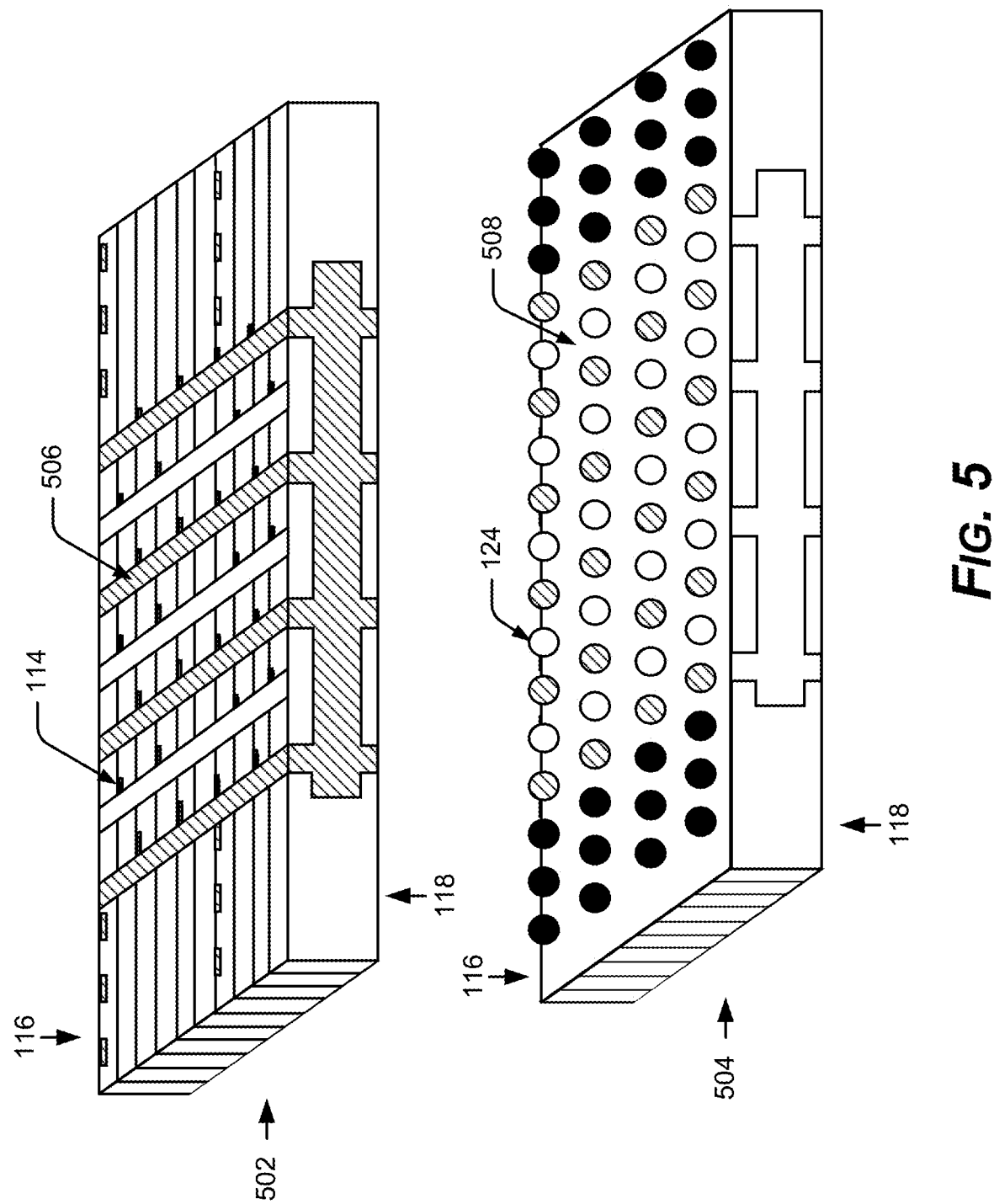
FIG. 5 is a diagram of example RDL construction and ball grid array placement on an example thin capacitor layer.

FIG. 5 shows two different capacitor layers 502 & 504 with types of redistribution layers (RDLs) 506 & 508 applied to a top 116 or bottom surface 118, or applied to both top 116 and bottom surfaces 118 of a given capacitor layer unit 502 or 504. The redistribution layers (RDLs) 506 & 508 may be fabricated on the electrodes 114 of the top surface 116 or the bottom surface 118 of the capacitor layer 102, or on both surfaces. An RDL 506 or 508 can configure the capacitor plates 108 & 110 into one or more capacitors within the example overall capacitor layer 102 according to the selected design of the package, and according to which plates the RDL 506 or 508 couples together. The applied RDL 506 or 508 may be connected to a semiconductor chip 104, die, integrated circuit, or to other instances of the capacitor layers 502 & 504.

A ball grid array 124 can be built on a surface 116 of a capacitor layer 504. Or, the ball grid array 124 may be attached to an intervening redistribution layer (RDL) 508 attached to the electrodes 114 of the top surface 116 or the bottom surface 118 of the capacitor layer 504.

A given capacitor layer 502 or 504 may contain approximately 5000 vertical capacitor plates 108 & 110 per linear centimeter of the stacked vertical capacitor plates, for example, interleaved with the vertical dielectric layers 112. In an example implementation, the capacitor layer 502 or 504 has dimensions of 2 cm×2 cm and a layer thickness of 200-300 μm, while containing approximately 10,000 vertical capacitor plates available for use by one or more chips 104, including connection of the vertical capacitor plates 108 & 110 in parallel or in series with each other.

In an implementation, a laminated stack (102 or 502 or 504) of vertical capacitor plates 108 & 110 may be fabricated in a wafer level microelectronics process, such as a reconstituted wafer process.

Example Processes

Figure 6:
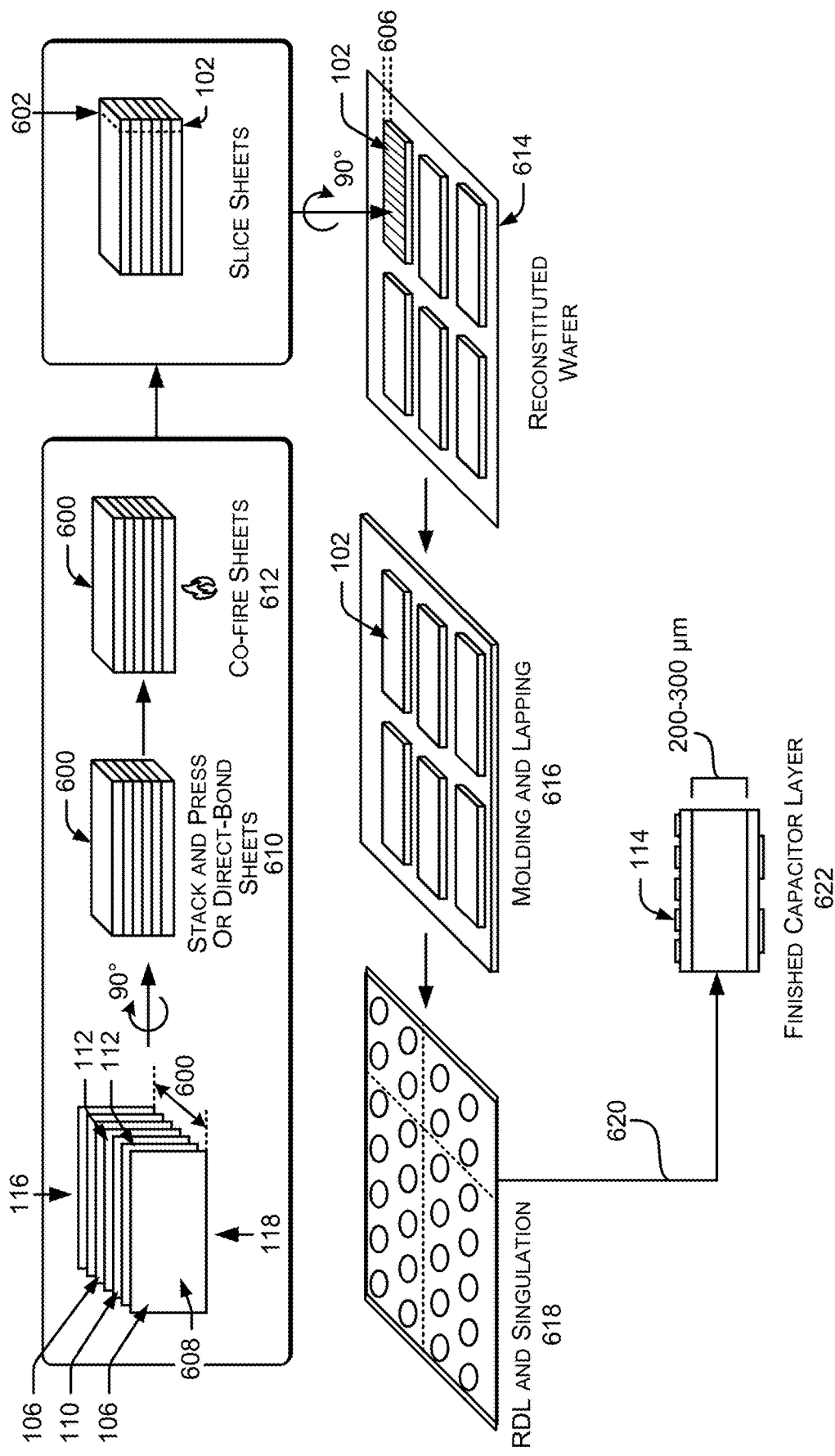
FIG. 6 is a diagram of an example process for making a finished thin capacitor layer.

FIG. 6 is a diagram of an example process flow, which can utilize some traditional capacitor forming steps and some traditional wafer level steps. Generally, as in FIG. 6, an example process may include laminating capacitor plates 108 & 110 spaced at approximately 0.1-3.0 μm apart from each other into a stack 600 with a dielectric 112 intervening between adjacent capacitor plates 108 & 110. The process may then further include slicing 602 or partitioning the stack 600 into layers 102 approximately in the range of 50-400 μm thick, each layer 102 including the capacitor plates 108 & 110 disposed vertically with respect to a top 116 and a bottom 118 of the layer 102, with approximately 5000 vertically disposed capacitor plates (for example) per linear centimeter of each layer 102. Each capacitor plate 106 & 108 & 110 may have electrodes 114 accessible from two or more surfaces of the capacitor layer 102.

In FIG. 6, the example process may further include printing 608 sheets, such as green sheets, including conductive planes as the capacitor plates 108 & 110, stacking and pressing 610 the sheets to make the stack 600, firing 612 the stack 600 to anneal lamination, slicing 602 or partitioning the stack 600 into the layers 102, and integrating the layers 102 into a reconstituted wafer 614 or panel.

An example process may further include molding and lapping 616 the layers 102 in a wafer level ball grid array (WLB) process, applying at least one redistribution layer (RDL) 618 to at least one side of the respective layers 102 on the reconstituted wafer 614 or panel, and singulating 620 the layers into individual capacitors 622 capable of bonding to a high number of interconnects in a thin-film process. As in FIG. 1, the example process may further include connecting a ball grid array 124 or 126 to electrodes 114 of an individual capacitor layer 102 at high resolution or a very fine pitch in the range of approximately 2-200 μm between electrodes 114 on a surface of the capacitor layer 102.

Figure 7:
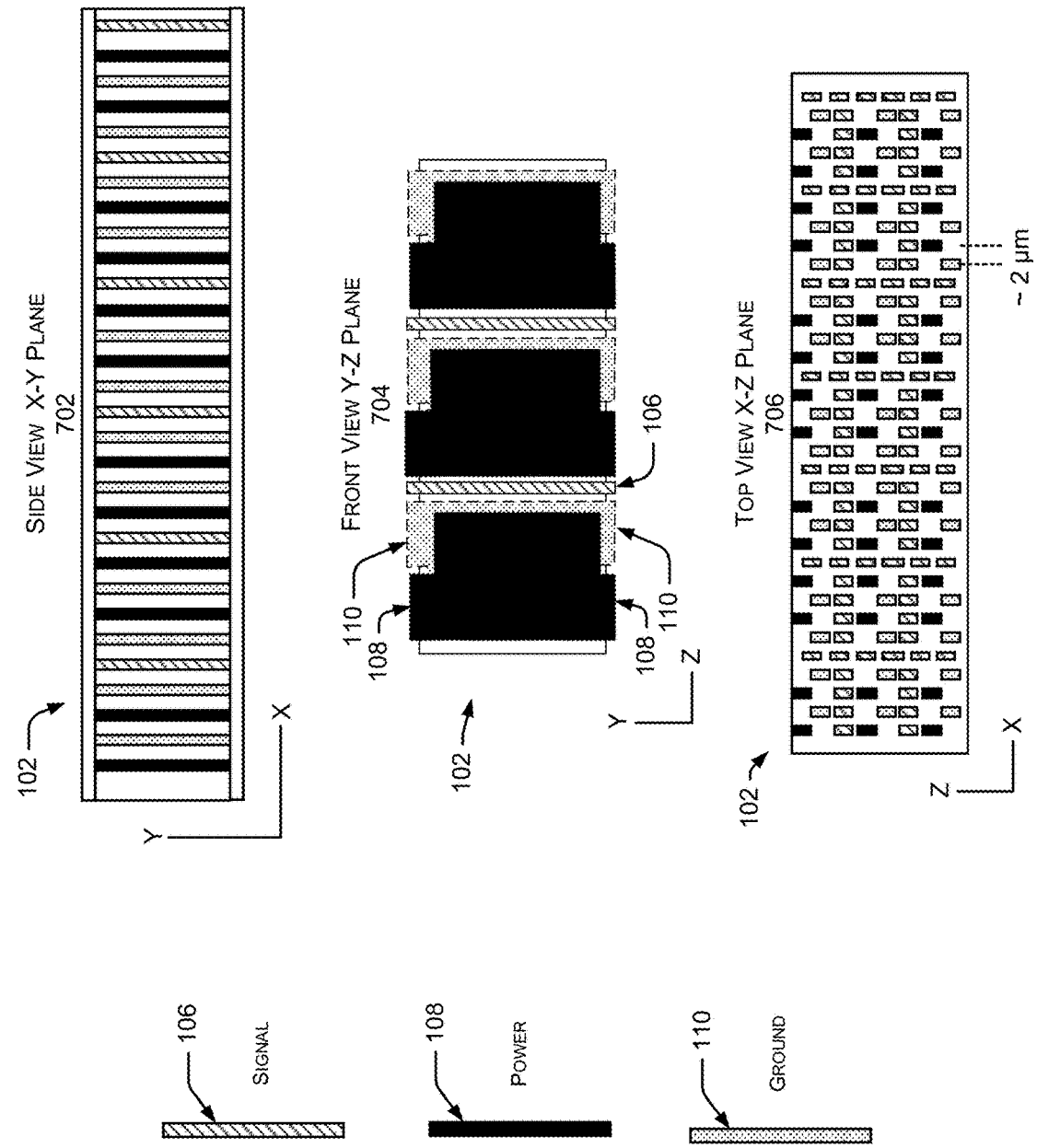
FIG. 7 is multiple diagrams of side, front, and top views of an example configuration of the thin capacitor layer with densely packed vertically disposed capacitive plates.

FIG. 7 shows one example implementation of the example capacitor layer 102, with example side 702, front 704, and top 706 views of the example capacitor layer 102 with vertical capacitor plates 108 & 110, and electrodes 114 of the capacitor plates 108 & 110 accessible on both top 116 and bottom surfaces 118 of the capacitor layer 102.

Figure 8:
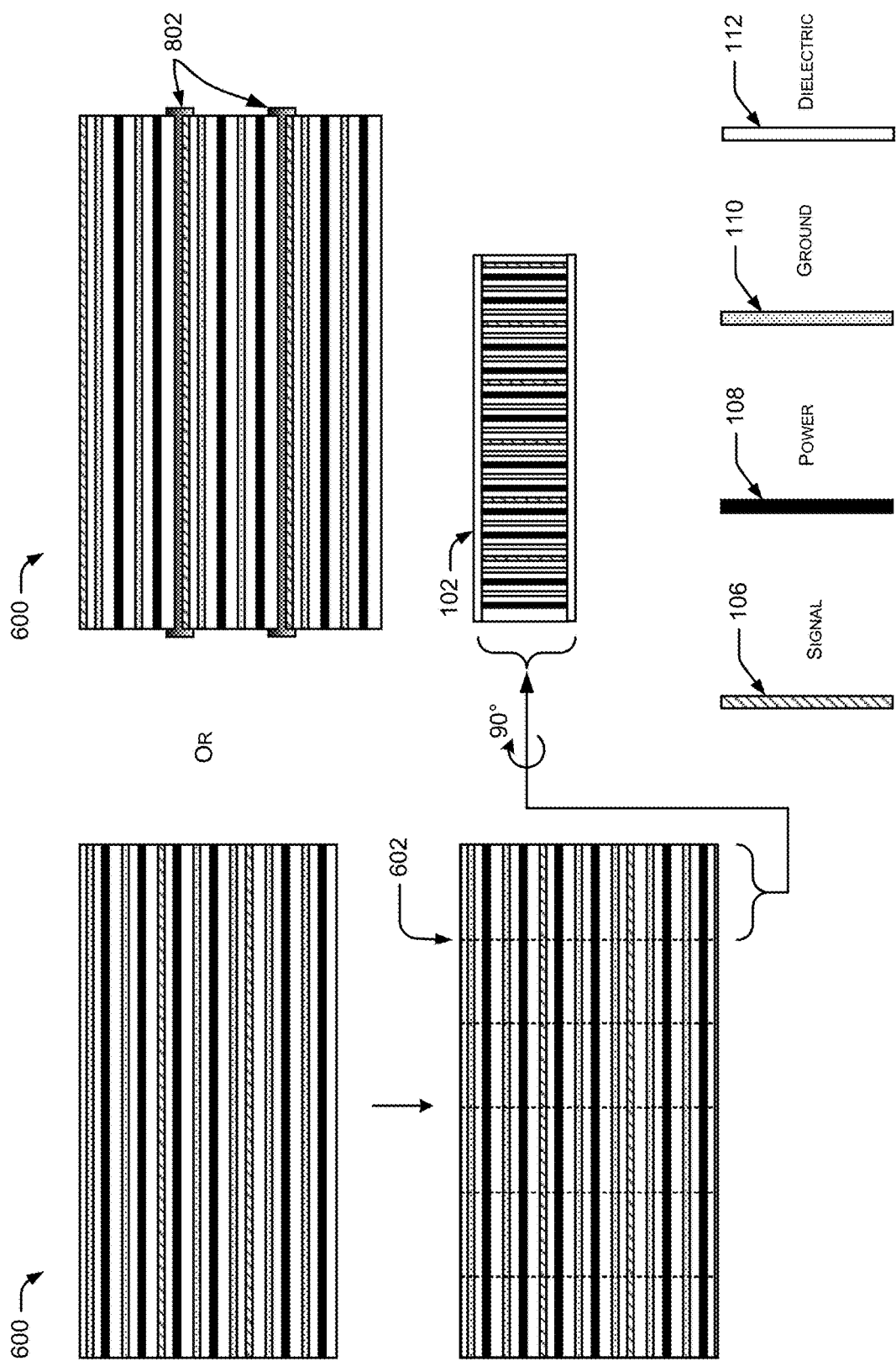
FIG. 8 is a diagram of example sheet stacking and slicing to make an example thin capacitor layer.

FIG. 8 shows example ways to stack individual plates 106 & 108 & 110 & 112, such as plates made of printed green sheets 112, for example, before pressing 610, direct-bonding, and/or melting 612 the plates into a single laminated stack 600. Multiple capacitor layer units 102 may also be formed by stacking a certain number of the capacitor plates (sheets) including separator or release layers 802, which establish individual laminated stack units 102, each comprising an individual unit capacitor layer 102.

FIG. 9 shows example ways to stack multiple of the finished capacitor layer units 102, to make ganged capacitors 902 with greater capacitance, for example. Multiple capacitor layers 102 as described herein may be incorporated into the design of a particular package with through-silicon-vias 904, coupling multiple instances of the capacitor layer units 102 to each other to make a stack, and then "stacking the stacks" by coupling multiple of the TSVs 904 together with a common bus 906 or connection to scale up capacitance, and so forth. The stacked capacitor layers 102 may be formed in one orientation, and then flipped or turned for use in another orientation, such as horizontal to vertical, and vice versa.

Figure 10:
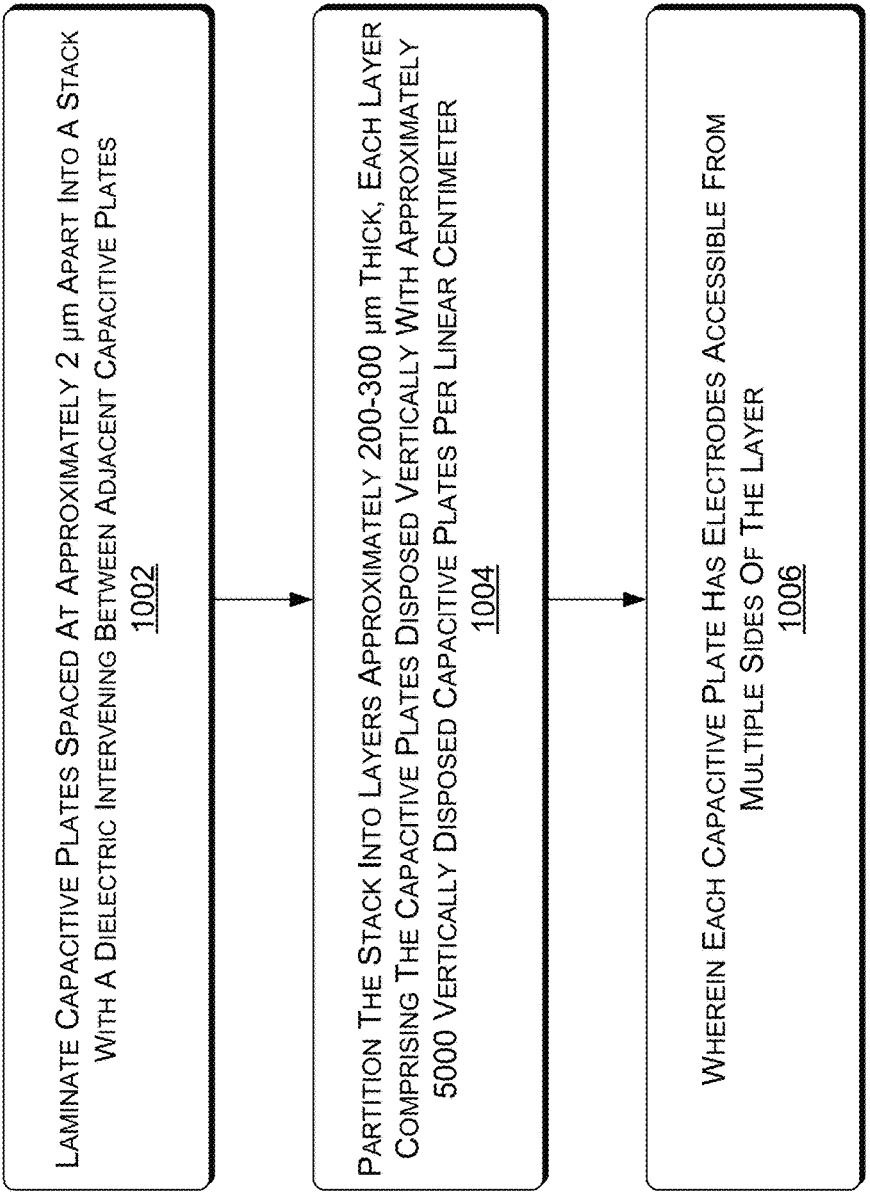
FIG. 10 is a flow diagram of an example method of making a thin sheet capacitor with vertically disposed plates, for microelectronics.

FIG. 10 shows an example method of making a vertical capacitor in a thin sheet, for microelectronic packages. In the flow diagram of FIG. 10, operations are shown in individual blocks.

At block 1002, capacitive plates spaced at approximately 2 microns (μm) from each other are laminated into a stack with a dielectric intervening between capacitive plates.

At block 1004, the stack is sliced or partitioned into layers approximately 200-300 μm thick, for example, each layer comprising the capacitive plates disposed vertically. Each linear (horizontal) centimeter of each layer may contain approximately 5000 vertically disposed capacitive plates, for example.

At block 1006, each capacitive plate may have electrodes accessible from at least two sides of the associated layer.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from those described above in alternative embodiments. The terms "example," "embodiment," and "implementation" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

In the specification and appended claims: the terms "connect," "connection," "connected," "in connection with," and "connecting," are used to mean "in direct connection with" or "in connection with via one or more elements." The terms "couple," "coupling," "coupled," "coupled together," and "coupled with," are used to mean "directly coupled together" or "coupled together via one or more elements." The term "coupled" may also be used herein to express a direct connection as well as a connection through one or more intervening circuits or structures.

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. An apparatus, comprising:
   a capacitor layer to underlie a semiconductor chip, a die, or an integrated circuit;
   vertical capacitor plates in the capacitor layer interleaved with vertical dielectric layers;
   electrodes of each vertical capacitor plate at a top surface and a bottom surface of the capacitor layer; and
   power pass-throughs or ground pass-throughs on the top surface and the bottom surface of the capacitor layer.

2. The apparatus of claim 1, wherein the capacitor layer has a thickness in a range of approximately 50-400 micrometers (μm) between the top surface and the bottom surface.

3. The apparatus of claim 1, wherein the capacitor layer comprises approximately 5000 vertical capacitor plates per linear centimeter of the capacitor layer.

4. The apparatus of claim 1, further comprising a direct-bond between the vertical capacitor plates.

5. The apparatus of claim 4, wherein a thickness of the capacitor layer is selected from the group consisting of a thickness in the range of approximately 50-100 µm, a thickness in the range of approximately 100-200 µm, and a thickness in the range of approximately 200-400 µm.

6. The apparatus of claim 1, wherein the vertical capacitor plates laminated with interleaved vertical dielectric layers are separated from each other by a spacing of approximately 0.1 µm to 3 µm.

7. The apparatus of claim 1, further comprising a redistribution layer (RDL) applied to the electrodes of the top surface of the capacitor layer or to the bottom surface of the capacitor layer.

8. The apparatus of claim 7, wherein the RDL connects select vertical capacitor plates to partition the capacitor layer into multiple capacitors, using serial or parallel connections.

9. The apparatus of claim 1, further comprising a first redistribution layer (RDL) applied to the electrodes of the top surface of the capacitor layer and a second redistribution layer (RDL) applied to the electrodes of the bottom surface of the capacitor layer.

10. The apparatus of claim 1, further comprising anodes and cathodes on both the top surface and the bottom surface of the capacitor layer.

11. The apparatus of claim 1, further comprising a filter structure or other circuit element on just one of the top surface or the bottom surface.

12. The apparatus of claim 1, wherein the capacitor layer has dimensions in the range of approximately 3.2×3.2 cm to approximately 0.8×0.8 cm and a layer thickness between approximately 50-400 µm.

13. The apparatus of claim 1, wherein each capacitor layer comprises at least a part of a reconstituted wafer for a wafer level microelectronics process.

14. An apparatus, comprising:
a capacitor layer to underlie a semiconductor chip, a die, or an integrated circuit;
vertical capacitor plates in the capacitor layer interleaved with vertical dielectric layers;
electrodes of each vertical capacitor plate at a top surface and a bottom surface of the capacitor layer; and
wherein the vertical capacitor plates comprise power planes, ground planes, and signal planes interleaved with each other and laminated with the vertical dielectric layers or an insulator.

15. The apparatus of claim 14, wherein adjacent electrodes on a top or a bottom of each vertical capacitor plate are approximately 100 µm apart from each other on each vertical plate of a single power plane or single ground plane, and the electrodes on a top or a bottom of each vertical capacitor plate are approximately 200 µm apart from each other on each vertical plate of a single signal plane.

16. The apparatus of claim 14, where respective electrodes of adjacent plates in the laminated stack are approximately 0.1 µm to 3 µm apart from each other across an intervening dielectric layer.

17. An apparatus, comprising:
a capacitor layer to underlie a semiconductor chip, a die, or an integrated circuit;
vertical capacitor plates in the capacitor layer interleaved with vertical dielectric layers;
electrodes of each vertical capacitor plate at a top surface and a bottom surface of the capacitor layer; and
a first ball grid array formed on the electrodes of the top surface or the bottom surface of the capacitor layer, for connecting a semiconductor chip, die, or integrated circuit to the capacitor layer.

18. The apparatus of claim 17, further comprising a second ball grid array on an opposing surface of the capacitor layer from the surface of the first ball grid array.

19. The apparatus of claim 17, further comprising a direct-bond between the vertical capacitor plates.

20. The apparatus of claim 17, wherein the capacitor layer has a thickness in a range of approximately 50-400 micrometers (µm) between the top surface and the bottom surface.

21. An apparatus, comprising:
a capacitor layer to underlie a semiconductor chip, a die, or an integrated circuit;
vertical capacitor plates in the capacitor layer interleaved with vertical dielectric layers;
electrodes of each vertical capacitor plate at a top surface and a bottom surface of the capacitor layer; and
a fan-out layer or a wafer level ball grid array attached to the electrodes of the top surface or the bottom surface of the capacitor layer or attached to a RDL.

22. The apparatus of claim 21, further comprising a direct-bond between the vertical capacitor plates.

23. The apparatus of claim 21, wherein the capacitor layer has a thickness in a range of approximately 50-400 micrometers (µm) between the top surface and the bottom surface.

24. An apparatus, comprising:
a capacitor layer to underlie a semiconductor chip, a die, or an integrated circuit;
vertical capacitor plates in the capacitor layer interleaved with vertical dielectric layers;
electrodes of each vertical capacitor plate at a top surface and a bottom surface of the capacitor layer; and
through-vias within the body of the capacitor layer to connect select vertical capacitor plates to partition the capacitor layer into multiple capacitors or to combine multiple capacitor layers into a larger ganged capacitor.

25. The apparatus of claim 24, further comprising a direct-bond between the vertical capacitor plates.

26. The apparatus of claim 24, wherein the capacitor layer has a thickness in a range of approximately 50-400 micrometers (µm) between the top surface and the bottom surface.

* * * * *